United States Patent [19]

Tarnowski

[11] Patent Number: 4,651,171
[45] Date of Patent: Mar. 17, 1987

[54] VACUUM SYSTEM FOR A CHARGED PARTICLE BEAM RECORDING SYSTEM

[75] Inventor: Andrew A. Tarnowski, New Canaan, Conn.

[73] Assignee: Image Graphics, Inc., Fairfield, Conn.

[21] Appl. No.: 727,340

[22] Filed: Apr. 25, 1985

[51] Int. Cl.⁴ .................. G01D 9/42; G01D 15/06
[52] U.S. Cl. ........................ 346/110 V; 346/159
[58] Field of Search ............... 346/110 V, 158, 159

[56] References Cited

U.S. PATENT DOCUMENTS

| | | | |
|---|---|---|---|
| 3,409,906 | 11/1968 | Jones | 346/110 V |
| 3,504,371 | 3/1970 | Reeds | 346/110 V |
| 4,300,147 | 11/1981 | Tarnowski | 346/110 V |

Primary Examiner—E. A. Goldberg
Assistant Examiner—Mark Reinhart
Attorney, Agent, or Firm—Roland T. Bryan

[57] ABSTRACT

An improved vacuum system for a system for accurately tracing on an electron sensitive film with an electron beam which passes through three (3) adjacent vacuum stages and where each stage has a predetermined vacuum level is disclosed herein. The vacuum system is a high performance, fully automatic, three (3) stage, differentially pumped system. Two (2) stages of the system each use a diffusion pump as a first pump means. The diffusion pump of the second stage is backed by a single direct drive mechanical pump and also acts as the backing pump for the diffusion pump of the first stage. The third stage uses a single direct drive mechanical pump for vacuum pumping its chamber.

5 Claims, 1 Drawing Figure

VACUUM SYSTEM FOR A CHARGED PARTICLE BEAM RECORDING SYSTEM

BACKGROUND OF THE INVENTION

1. Field of the Invention

This invention relates to charged particle beam recording on film and more specifically to a system for accurately tracing with an electron beam on an electron sensitive film. Such a system finds use in recording graphic images where a high degree of resolution and accuracy of placement is needed. Thus, electron beam recording is highly useful for, among other things, television recording, computer output microfilm, mass data storage, wide bandwidth signal recording, satellite photography, automated cartography, computer micrographics and seismic recording.

2. Description of the Prior Art

Essential elements of an electron beam recorder (EBR) are an electron gun, an electro-optical focusing and deflection system, an electron sensitive film and film gate. In operation, the electron beam traces an image across the recording area on the emulsion side of a stationary film in the film gate. Because scattering and attenuation of the electron beam occurs in air, electron beam recording must be conducted in a high vacuum. Generally, a three (3) stage vacuum system is used in electron beam recorders with the highest degree of vacuum in the vicinity of the electron gun, a lower degree of vacuum in the vicinity of the emulsion side of the film and the lowest degree of vacuum in the film transport chamber.

The vacuum system of the charged particle beam recorder is a high performance, fully automatic, three (3) stage, differentially pumped system which ensures that proper vacuum is maintained in every section of the beam recorder.

Typically, the electron gun chamber, stage 1, is operated at $10^{-7}$ to $10^{-6}$ Torr, the electron optics chamber, stage 2, at about $10^{-4}$ Torr and the film chamber, stage 3, at about 100 millitorr.

The vacuum system uses two diffusion pumps to provide the required degree of vacuum in stages 1 and 2. These diffusion pumps have very low oil backstreaming rates and in addition, are provided with optically dense, high conductance baffles to minimize oil contamination problems. The baffle for the diffusion pump connected to the electron gun chamber is cooled thermoelectrically.

Three direct drive mechanical pumps are also used in the vacuum pumping system of the electron beam recorder. Two of these pumps, are used as backing pumps for the diffusion pumps of stage 1 and stage 2, separately. The third, mechanical pump, is connected directly to the film chamber (stage 3).

A good vacuum system is essential for a long operating life of the cathode of the electron gun. Typically the electron gun used in the beam recorder is a triode with a directly heated tungsten emitter. The aperture in the grid cup of the electron gun is small resulting in a less divergent beam and consequently in improved resolution. Also the aperature in the anode is small and is sensitive to contamination arising from the pumping system.

The cathode (directly heated therminonic emitter) of the electron gun is a TYPE AR filiament used for applications where the ultimate stability is demanded and long operating life is important. Typically the element is of a tungsten-rhenium alloy to ensure ultimate performance and has a mean time between failures of thousands of hours, provided that it is operated in an adequately high vacuum. While the cost of replacement filaments is relatively inexpensive, the service costs for installation of replacement filaments is considerable. Moreover, replacing filaments results in recorder shutdown time and further loses incurred thereby. These factors make extension of filament operating life important.

Obviously, therefore, if one were able to achieve an equivalent or better three stage vacuum system in a more efficient manner, a substantial savings would be realized in costs of pump means, shutdown loses and installation service charges. A need has then been shown to exist in the prior art for a new and improved vacuum system for a charged particle beam recorder.

One technique for solving the problem which has been employed was to provide a three (3) stage vacuum system using a single mechanical pump as a backing pump to both diffusion pumps. This arrangement, however, proved to be unacceptable as back pressures were created by the common feed from the discharge of the two diffusion pumps into the mechanical pump. As a result the pressure reduction to the levels sought for the first vacuum stage was not obtained.

SUMMARY OF THE INVENTION

It is, therefore, an object of the present invention to provide for an improved vacuum system for a charged particle beam recorder wherein the number of pumps required to effectuate the necessary vacuum has been reduced from three (3) mechanical pumps to two (2) mechanical pumps.

It is another object of the present invention to provide for an improved vacuum system for a charged particle beam recorder wherein a better vacuum is obtained in the electron gun chamber allowing for improvement of the service life of the electron gun and allowing the use of other electron emmitters which are more sensitive to contamination.

It is a still further object of the present invention to provide for an improved vacuum system allowing for the reduction of the number of other component parts and to allow the usage of lower cost system components.

An improved vacuum system for a system for accurately tracing on an electron sensitive film with an electron beam which passes through three (3) adjacent vacuum stages, each with a predetermined vacuum level is disclosed herein. The vacuum system is a high performance, fully automatic three (3) stage differentially pumped system. Two (2) stages of the system each use a high vacuum pump to obtain the necessary vacuum in the system. The high vacuum pump of the electron optics chamber acting as the first pump means for that stage and also acting as a backing pump to the high vacuum pump of the electron gun chamber gun. A single direct drive mechanical pump backs up these pumps. The film chamber, stage 3, uses a single direct drive mechanical pump for vacuum pumping its chamber.

BRIEF DESCRIPTION OF THE DRAWINGS

The above aspects and advantages of the invention as well as others will become apparent from the detailed description of the preferred embodiment of the invention considered in conjunction with the drawings which should be construed in an illustrative and not in a limiting sense.

DETAILED DESCRIPTION OF THE DRAWINGS

Figure 1:
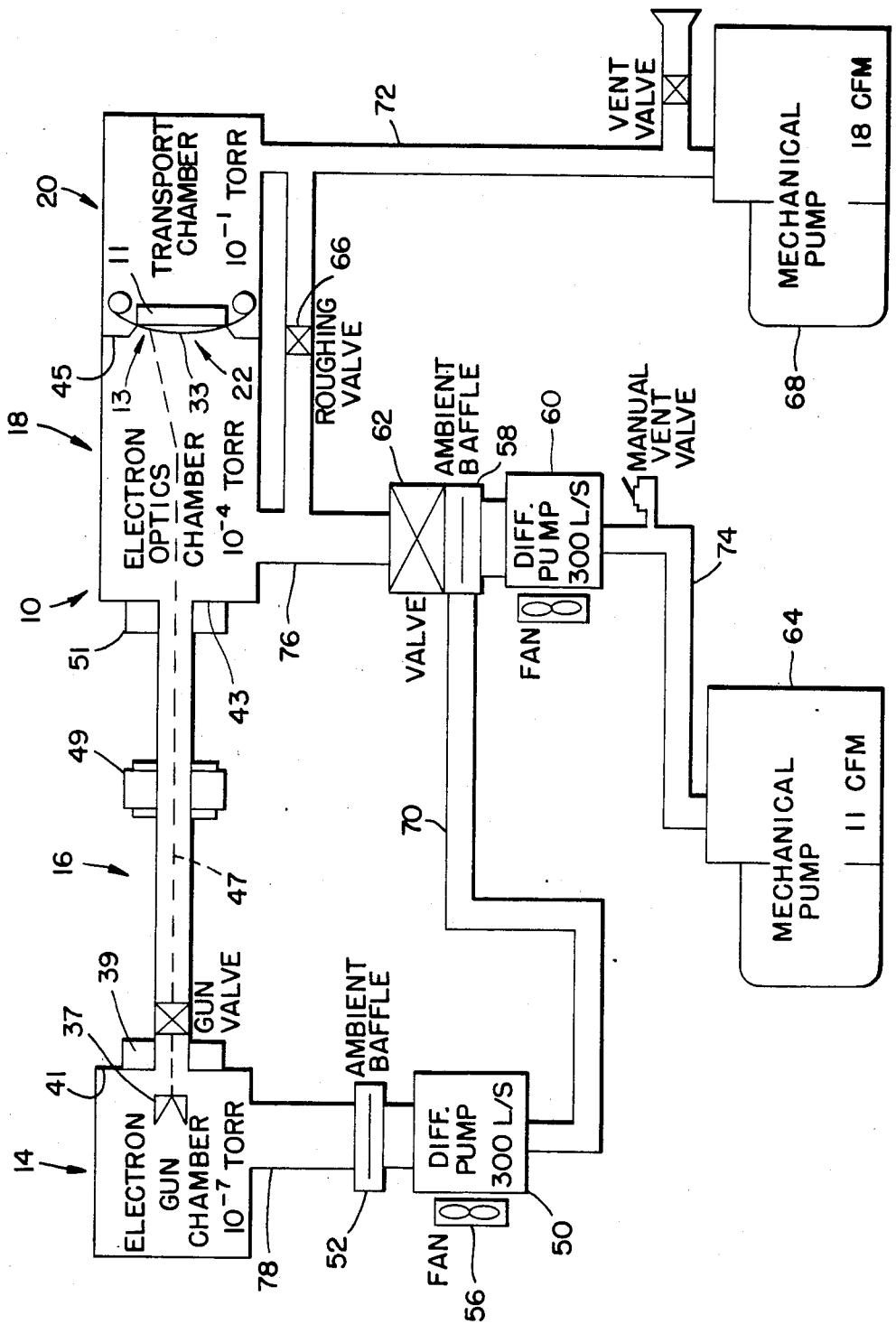
FIG. 1 is a schematic view of an electron beam recorder system in accordance with the present invention.

Referring to FIG. 1, a schematic representation of an improved EBR vacuum system showing three (3) basic stages is illustrated generally at 10. Each stage requires a different degree of vacuum for different reasons. The complete electron beam recorder includes a vacuum housing which is divided into four sections, 14, 16, 18 and 20 by partial walls 41, 43 and 45.

Contained within the gun section 14 is a conventional triode electron gun with a directly heated thermionic emitter. An electron beam 47 is emitted from the electron gun 37 and passes through the aperture of partial wall 41 into section 16.

The degree of vacuum to be maintained in the gun section 14 is determined by considerations of cathode life and contamination of various critical component surfaces, usually apertures. The cathode of the EBR may be a directly heated tungsten wire, wherein its operational life is determined by two factors: (a) the rate of evaporation of the tungsten which is a function of operating temperature and (b) the rate of chemical reaction between the hot cathode and the ambient gases which is directly proportional to the operating pressure. In the invention herein the vacuum in the gun section 14 is improved over the prior construction so that it is better than $10^{-7}$ Torr and thus allows use of contamination sensitive cathodes such as lanthanium hexaboride.

In the gun section 14, vacuum stage 1 is reduced to a high vacuum by first high vacuum pump means, diffusion pump 50. Other pumps of this class comprise turbomolecular and cryogenic and ion pumps. A first conduit means 78 connects the suction of said pump 50 to section 14. An ambient baffle 52 is located between section 14 and diffusion pump 50 and is used to prevent oil backstreaming to the hot cathode. Fan 56 cools the diffusion pump.

Sections 16 and 18, vacuum stage 2, are maintained at a lesser vacuum by another high vancuum pump such as diffusion pump 60. A second conduit means 76 connects the suction side of said pump 60 to pump down the beam stage or electron optics chamber section 18.

Surrounding section 16 are conventional electromagnetic coils 39, 49 and 51. The input signals to coil 51 are corrected for distortions in the trace produced by the electron beam 47 on the electron sensitive film 33.

Interconnected between the discharge side of stage 18 and the suction side of diffusion pump 60 are valve 62 and ambient baffle 58. Valve 62 regulates the pump down cycle to achieve the proper vacuum. Ambient baffle 58 is used to condense hot diffusion pump oil and thereby prevent oil backstreaming to the electron optics chamber.

Connected to the second conduit means 76 at the ambient bafflie 58 is the discharge of diffusion pump 50 by conduit 70. Whereby, as to the discharge of said first stage, said diffusion pump 60 acts as backing pump, thereto. A mechanical vacuum pump 64 acts as a further backing pump to receive the discharge of said pump 60 via conduit 74.

The electron beam 47 passes through sections 16 and 18 and into the film transport stage section 20 where it strikes the recording film 33. Section 20 contains the film gate indicated generally at 22, which includes curved frame 13 and platen 11. Section 20, stage 3, is maintained at lesser vacuum by a third vacuum pump means, for instance a mechanical pump 68.

The reason for maintaining the recording film or transport chamber under vacuum is to ensure that the proper operating vacuum can be achieved in the other two stages of the EBR. The degree of vacuum required in this stage will depend on such factors as: the vacuum conductance between the film chamber and the rest of the EBR, the area of the recording film which at any given moment outgasses into the high vacuum section of the EBR, the outgassing rate of the recording film, the rate at which the recording film is transported and the vacuum pumping speed for the other sections of the EBR.

All three vacuum stages of the EBR possess vacuum sensors which automatically control opening and closing of appropriate valves during a pump down cycle when the proper pressure has been achieved in a particular section.

Roughing valve 66 allows for the attainment of an initial vacuum in the order of $10^{-1}$ Torr in both the electron optics chamber and film or transport chamber by mechanical pump 68. Once said initial pressure is obtained, valve 66, closes, and valve 62 then opens. At the time that valve 62 opens, diffusion pump 60, and mechanical pump 64, become effective to complete the pump down of the electron optics chamber to $10^{-4}$ Torr.

The pump down of the electron gun chamber is obtained according to the following sequence. Diffusion pump 50 acting through ambient 52 is activated at the same time as the powering of diffusion pump 60. As pump down by pump 50 is begun, backpressure, in conduit 70, is prevented by the suction of pump 60. The backpressure in conduit 74 on diffusion pump 60 is alleviated by mechanical pump 64. The present system provides a lower and cleaner vacuum in the electron gun chamber and stage.

While I have illustrated and described the preferred embodiment of my invention, it is to be understood that such embodimenft is merely illustrative and not restrictive and that variation and modifications may be made therein without departing from the spirit and scope of the invention. I therefore do not wish to be limited to the precise details set forth but desire to avail myself of such changes as fall within the purview of my invention.

I claim:

1. In a system for accurately tracing on an electron sensitive film with an electron beam which passes from a gun stage through a beam stage for imaging on a film in a transport stage and where each stage has a predetermined vacuum level, an improved vacuum system for use in said system comprising:
    (a) first conduit means connected to said gun stage for discharge of the contents thereof,
    (b) first high vacuum pump means the suction of which is connected to said first conduit means,
    (c) a second conduit means connected to said image beam stage for discharge of its contents,
    (d) a second high vacuum pump means having its suction connected to said second conduit means,
    (e) the discharge from said first high vacuum pump means connected to said second conduit means and on the suction sside of said second high vacuum pump whereby as to the discharge of said gun stage said second pump means acts as a backing pump thereto and achieves a vacuum greater than $10^{-6}$ Torr. in said gun stage, (f) a mechanical vacuum pump means having its suction connected to receive the discharge of said second pump means, and, (g) a second mechanical pump means having its suction connected to pump down the film transport stage.

2. A vacuum system as claimed in claim 1 whereby said first and second vacuum pump means are diffusion pumps.

3. A vacuum system as claimed in claim 1 wherein said first and second conduit means each contain baffles to prevent backstreaming of oil to said vacuum stages.

4. A vacuum system as claimed in claim 3 wherein at least one of said oil condensation baffles is of an ambient type.

5. A vacuum system as claimed in claim 3 where said oil condensation baffles are of the ambient type.

* * * * *